United States Patent [19]

Carlton et al.

[11] 4,253,057
[45] Feb. 24, 1981

[54] COMPENSATION INDICATOR FOR ATTENUATION PROBE

[75] Inventors: Dale E. Carlton, Hillsboro; William G. Wilke, Beaverton, both of Oreg.

[73] Assignee: Tektronix, Inc., Beaverton, Oreg.

[21] Appl. No.: 33,592

[22] Filed: Apr. 26, 1979

[51] Int. Cl.³ .......................................... G01R 27/00
[52] U.S. Cl. ............................. 324/57 PS; 328/148; 328/162
[58] Field of Search ............... 324/57 R, 57 PS, 78 Z, 324/62 R; 328/162, 148; 307/360

[56] References Cited

U.S. PATENT DOCUMENTS 2,981,851  4/1961  Wier ............................ 324/57 PS X
2,982,887  5/1961  Seeley, Jr. ....................... 328/148 X
4,070,615  6/1978  Crop ................................. 324/57 R

OTHER PUBLICATIONS

Peach et al., Peak-Shift Measurements, IBM Technical Disclosure Bulletin, Feb. 1971, pp. 2728-2730.

Primary Examiner—Stanley T. Krawczewicz
Attorney, Agent, or Firm—George T. Noe

[57] ABSTRACT

A circuit including a peak detector detects the distortion of the leading corner of a square-wave reference signal in the over-compensated condition of an attenuator probe and turns on an indicator light. The light turns off as the probe is adjusted to the properly compensated condition because the distortion is no longer detected.

5 Claims, 4 Drawing Figures

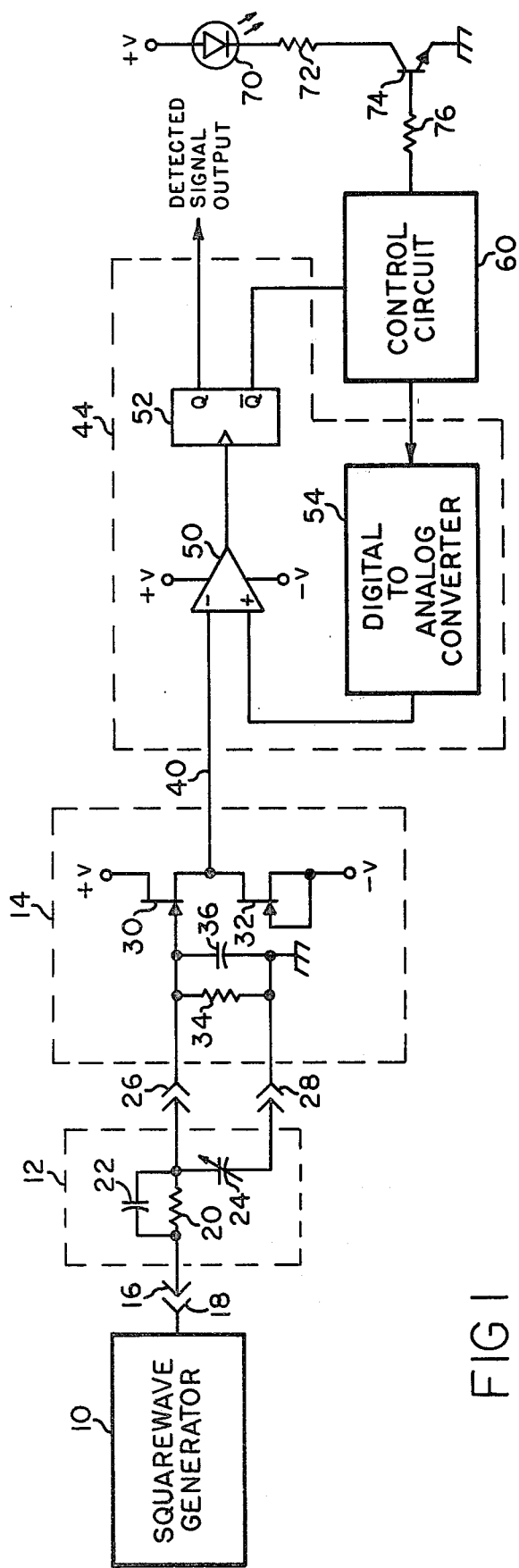
FIG 1
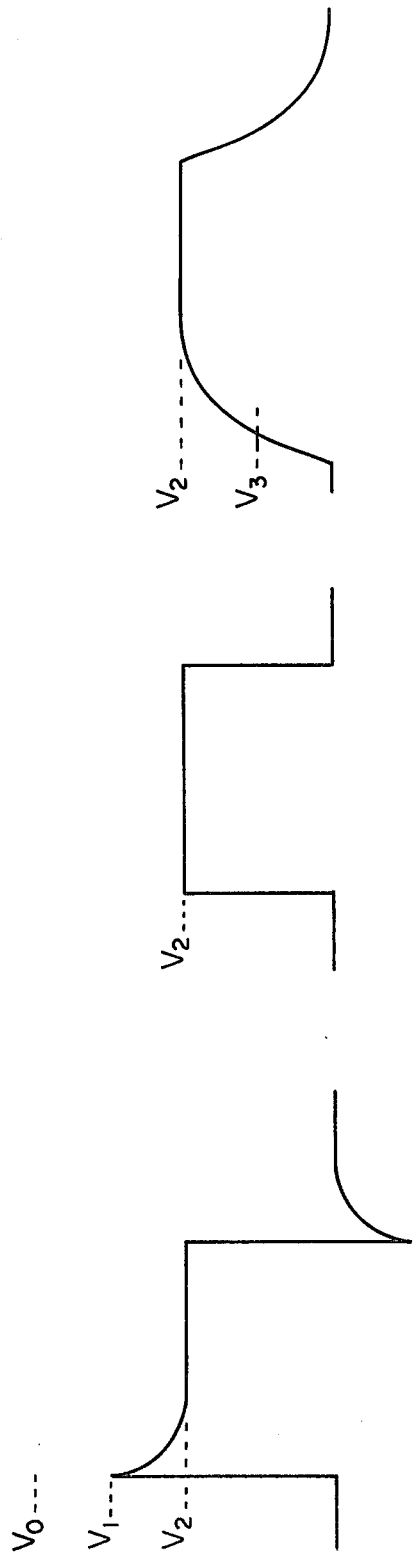
FIG 2A
FIG 2B
FIG 2C

COMPENSATION INDICATOR FOR ATTENUATION PROBE

BACKGROUND OF THE INVENTION

This invention relates to impedance-matching devices in general, and in particular to devices for indicating the proper adjustment of a frequency-compensated attenuation probe.

Attenuation probes are generally associated with oscilloscopes; however, they may be used as a means for coupling an input signal to any electronic test and measurement instrument. A typical method of compensating the probe is to connect it to an oscilloscope and apply a precise square-wave reference signal thereto while viewing the resultanting signal on the oscilloscope screen. Distortions in the square-wave signal produced by the impedance mismatch are indicated on the wave form by either peaked or a rolled-off leading edge of the square-wave. The probe may be adjusted while watching the display to adjust the square-wave to a square leading corner.

Other electronic instruments having wide-band capability, such as events counters and the like, have come into wide usage, and such instruments lend themselves to usage of an attenuation probe therewith to reduce the amplitude of an input signal to a usable level. However, these instruments do not have a display device for viewing an input waveform and it is difficult to properly compensate the probe without the use of an oscilloscope. One solution to this problem has been described in U.S. Pat. No. 4,070,615, which patent is assigned to the assignee of the present invention. This patent teaches the application of a square-wave signal to both inputs of a differential amplifier, one input receiving the signal directly and the other input receiving the signal via an attenuation probe and input circuitry of an electronic instrument. Any impedance mismatch causes an output from the differential amplifier which is rectified and filtered to produce a control voltage to be applied to an indicator light. A drawback to this system is that the indicating circuitry has the undesirable effect of loading down the input. Furthermore, proper compensation of the probe is indicated when the light is its brightest, and thus accuracy is dependent upon the judgment of the person compensating the probe.

SUMMARY OF THE INVENTION

In accordance with the present invention, a compensation indicator for an attentuation probe is provided in which proper compensation of the probe is indicated when a light turns off during the compensation adjustment. A square-wave signal is applied via an attenuation probe and input circuitry of an electronic instrument to a peak detector. The peak detector iteratively detects the peak voltage of the square-wave signal. When a detected peak voltage is greater than that previously stored, an indicator light is turned on. When a detected peak voltage is less than or equal to a previously stored voltage, the indicator light is turned off and the new peak value stored in place of old one. Thus, an attenuator probe may be adjusted from an over compensated condition while watching the indicator light, which turns off when the properly compensated condition is reached.

It is therefore one object of the present invention to provide indication of proper compensation during the adjustment of attenuation probe.

It is another object of the present invention to provide a compensation indicator for an attenuation probe which does not add substantial additional circuit components to the input circuit of an electronic instrument.

It is a further object of the present invention to provide a compensation indicator for an attenuation probe which does not add additional impedance loading to the input circuit of an electronic instrument.

It is an additional object of the present invention to provide a method for compensating an attenuation probe without the use of an oscilloscope.

Further objects, features, and advantages will be apparent from consideration of the following description taken in conjunction with the accompanying drawings.

DRAWINGS

FIG. 1 shows a schematic of the preferred embodiment of the present invention; and FIGS. 2A–2C are waveforms indicating respectively the over-compensated, the compensated, and the under-compensated conditions of an attenuation probe.

DETAILED DESCRIPTION OF THE INVENTION

FIG. 1 shows a preferred embodiment of the present invention, and may be described in connection with the waveforms of FIGS. 2A–2C. A reference signal having a constant amplitude and frequency is generated by a square-wave generator 10. The square-wave reference signal, the duty cycle of which is not critical and may be any value, is applied via an attenuation probe 12 to an input buffer amplifier stage 14 of an electronic instrument. The probe 12 includes a probe tip 16 connected to a jack 18, and further includes at least one internal resistor 20 shunted by a capacitor 22, and an adjustable capacitor 24. The probe 12 is connected to the input circuit 14 via input connectors 26 and 28. Input connector 26 passes the square-wave reference signal, while input terminal 28 provides a ground connection for the probe. The input buffer amplifier 14 may suitably include a first field-effect transistor 30 and a second field-effect transistor 32 serially connected between suitable sources of positive and negative voltage. Field-effect transistor 30 provides a high input impedance to the signal, and behaves as a source follower. Field-effect transistor 32 provides a current source for operation of field-effect transistor 30. The input impedance of input buffer amplifier 14 is established by the parallel combination of a resistor 34 and a capacitor 36. Resistor 34 may suitably be a one-megohm resistor, and the value of capacitor 36 may be chosen to provide a predetermined frequency response. Probe 12 may suitably be an attenuation probe having any predetermined attenuation ratio, for example, 5:1, 10:1, 100:1, etc. The value of resistor 20 inside the probe is chosen to provide the proper voltage divider ratio in conjunction with resistor 34. Capacitors 22 and 24 may be chosen to provide the appropriate capacitance divider ratio in conjunction with capacitor 36 to provide proper frequency compensation for the probe. That is, the impedance of probe 12 should be matched to the impedance of input buffer amplifier 14 to provide best frequency response so that an input signal is not distorted because of impedance mismatch. Capacitor 24 is typically adjustable through a 360° range to permit such probe to be operated with a number of electronic instruments. An operator connects the probe and adjusts the capacitor 24 for best compensation. Such probe 12 and input buffer amplifier 14 have been utilized for many years and are well known to those skilled in the art. The square-wave reference signal at the output of input amplifier 14 on line 40 may appear as one of the wave-forms shown in FIGS. 2A-2C. The wave form of FIG. 2A is an over-compensated square-wave from an improperly compensated probe. Here, the leading edge overshoots the square-wave amplitude and thus has a peaked leading edge FIG. 2B is a properly compensated square-wave signal from a properly compensated probe. That is, the square-wave signal is not distorted at all. The waveform of FIG. 2C is an under-compensated square-wave in which the leading edge rolls off to the desired amplitude. As the capacitor 24 of the probe is rotated through its range, all of the waveforms of FIGS. 2A-2C can be obtained; however, the probe is properly compensated when the waveform is undistorted as shown in FIG. 2B.

The output of input amplifier 14 is applied to a peak detector circuit 44. The peak detector 44 in this embodiment comprises a comparator 50, a flipflop 52, and a digital-to-analog converter 54. The signal from amplifier 14 is applied via line 40 to the inverting input of comparator 50, where such signal is compared with a triggering level voltage applied from the digital-to-analog converter 54 to the non-inverting input thereof. When the signal voltage exceeds the triggering level voltage, the output of comparator 50 switches, producing a negative-going clock edge which is applied to flipflop 52. The flipflop 52 switches states each time a peak signal is detected. A control circuit 60 monitors the output of flipflop 52, and generates a digital signal which is applied to the digital-to-analog converter 54 to change the triggering threshold by some predetermined increment. Thus, it can be discerned that if it is desired to detect peak voltage, a repetitive signal is applied to the inverting input of comparator 50, and the comparator switches each time the signal voltage exceeds the trigger threshold from the digital-to-analog converter 54. The control circuit 60 then causes the output of converter 54 to ratchet incrementally toward the peak voltage until the comparator ceases to switch on each cycle. At that point, the trigger threshold voltage is equal to the peak amplitude value of the input signal. The control circuit 60 may suitably include a memory device which stores the value of each previous trigger threshold, and this information may be made available as needed within the electronic instrument. Also connected to control circuit 60 is an indicator lamp circuit which may comprise a light-emitting diode diode 70, a resistor 72, and a transistor switch 74 serially connected between a suitable source of positive voltage and ground. A control signal is applied from the control circuit 60 through a resistor 76 to the base of transistor 74 to cause the switching thereof.

The peak detector circuit 44 and the control circuit 60 may be a portion of signal conditioning circuits within an electronic instrument, for example, such as circuits which might be found in an events counter or the like. Thus, a peak detector other than the one shown may be suitable, depending upon its intended function within the instrument. Control circuit 60 may suitably be an arrangement of logic gates coupled to a memory, or in a more sophisticated form, it may be a microprocessor or the like. The light-emitting diode 70 may be energized to indicate a triggered condition. The control circuit 60 stores the value of the trigger threshold, and as long as signal peaks are being detected as indicated by the switching of flipflop 52, the control circuit 60 applies a positive voltage to the base of transistor 74, holding the transistor on and energizing the indicator light. Similarily, when the detected voltage is equal to or less than the stored threshold value, as indicated by the lack of switching of flipflop 52, the indicator light 70 is switched off.

For probe compensation, the circuit operates as follows: the triggering level voltage at the non-inverting input of comparator 50 is initially set to some high voltage level $V_0$, which may be the upper voltage limit of the triggering window. Under control of the control circuit 60, the triggering threshold is lowered until a peak voltage of the reference signal is detected. No matter how the probe 12 is adjusted, the detected peak voltage will be either $V_1$ or $V_2$. The person compensating the probe will know that this condition has been reached because the indicator light 70 will come on momentarily and then turn off as the threshold level is adjusted toward the detected peak value. The person compensating the probe now makes the compensation adjustment while watching the indicator light. For example, if the probe is initially under-compensated, the light will remain off until the leading edge of the square-wave signal is raised above the detected and stored peak level $V_2$, indicating an over-compensated condition. Of course, at this point the indicator light will come on, and the probe can be adjusted until the light turns off, at which point the waveform will be as shown in FIG. 2B, indicating a properly compensated probe. If the probe is initially over-compensated, detecting and storing $V_1$ as shown in FIG. 2A, as the compensation adjustment is made, the probe will actually be adjusted to the under-compensated condition, and the voltage level $V_2$ will be detected and since $V_2 < V_1$, $V_2$ will be stored, replacing the $V_1$ value previously stored. This will be indicated by the light 70 turning on momentarily and then turning off as before. Proper compensation is then adjusted from the under-compensated condition to the over-compensated condition and back as previously described.

It will be obvious to those having ordinary skill in the art that many changes and modifications may be made in the details of the above-described embodiment of the present invention. For example, a different type of buffer amplifier or peak detector could be employed without changing the basic operating principles of the system hereinabove described. Therefore, the scope of the present invention should be determined only by the following claims.

We claim:

1. A system for indicating proper compensation of an adjustable frequency compensation network, comprising:

means for applying a square-wave reference signal to said frequency compensation network;

peak detector means coupled to the output of said frequency compensation network for detecting peak voltages of said reference signal;

control means including memory means coupled to said peak detector means for developing a control signal which is in a first condition when a peak voltage exceeds a previously stored peak voltage and in a second condition when a peak voltage is equal to or less than a previously stored peak voltage; and indicator means responsive to said control signal for providing an indication of when said control signal changes from said first condition to said second condition.

2. A system in accordance with claim 1 wherein said peak detector means includes a comparator for generating a trigger signal when the voltage of said reference signal passes through a trigger threshold voltage, and said control means includes means for automatically adjusting said trigger level voltage to previously stored peak voltage values.

3. A system in accordance with claim 1 wherein said indicator means comprises an indicator light which is energized during said first condition of said control signal.

4. A system in accordance with claim 1 wherein said control means replaces said previously stored peak voltage with a new stored peak voltage when said new stored peak voltage is less than said previously stored peak voltage.

5. A circuit for indicating the adjustment of a frequency-compensated attenuator probe coupled to the input circuit of an electronic instrument, comprising:
  a source of reference signals having a square leading corner and a flat top;
  a peak detector for detecting peak voltages of said reference signals;
  a signal path from the reference signal source through the probe and input circuit to said peak detector;
  means connected to said peak detector for storing peak voltages of said reference signals and replacing said stored peak voltages with new peak voltages when said new peak voltages are less than said stored voltages; and
  indicator means connected to said peak voltage storing means for providing an indication of a condition in which said new peak voltages are greater than said stored peak voltages.

* * * * *